US009157821B2

(12) United States Patent
Robert et al.

(10) Patent No.: US 9,157,821 B2
(45) Date of Patent: Oct. 13, 2015

(54) PRESSURE MEASUREMENT DEVICE HAVING AN OPTIMIZED SENSITIVITY

(75) Inventors: Philippe Robert, Grenoble (FR); Guillaume Jourdan, Grenoble (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 611 days.

(21) Appl. No.: 13/538,143

(22) Filed: Jun. 29, 2012

(65) Prior Publication Data

US 2013/0000411 A1   Jan. 3, 2013

(30) Foreign Application Priority Data

Jul. 1, 2011   (FR) ...................................... 11 55954

(51) Int. Cl.
*B81B 7/00* (2006.01)
*G01L 9/00* (2006.01)

(52) U.S. Cl.
CPC .............. *G01L 9/0052* (2013.01); *G01L 9/001* (2013.01); *G01L 9/006* (2013.01); *G01L 9/0019* (2013.01); *G01L 9/0073* (2013.01); *B81B 2203/0127* (2013.01); *B81B 2203/0154* (2013.01); *B81B 2203/0307* (2013.01); *B81B 2203/053* (2013.01)

(58) Field of Classification Search
CPC ............ G01L 9/006; B81B 2203/0127; B81B 2203/0154; B81B 2203/0307; B81B 2203/053
USPC .......................................................... 73/708
See application file for complete search history.

(56) References Cited

U.S. PATENT DOCUMENTS 5,305,643 A     4/1994  Thomas et al.
5,317,917 A  *  6/1994  Dufour .......................... 73/702
5,458,000 A  * 10/1995  Burns et al. .................... 73/708

(Continued)

FOREIGN PATENT DOCUMENTS

DE   10 2006 011 545 A1   9/2007
EP        0 143 738 A1     6/1985

(Continued)

OTHER PUBLICATIONS

Preliminary Search Report issued Feb. 28, 2012 in French Patent Application No. 1155954 (with English Translation of Categories of Cited Documents).

(Continued)

*Primary Examiner* — Lisa Caputo
*Assistant Examiner* — Tran M Tran
(74) *Attorney, Agent, or Firm* — Oblon, McClelland, Maier & Neustadt, L.L.P.

(57) ABSTRACT

A MEMS and/or NEMS pressure measurement device includes a deformable membrane suspended on a substrate, one of the faces of the membrane configured to be subjected to a pressure to be measured, a detector configured to detect deformation of the membrane and being provided at least partly on the substrate; and a non-deformable transmission device configured to transmit the deformation of the membrane to the detector, said transmission device rotatably hinged to the substrate about an axis substantially parallel to the plane of the membrane and being provided facing another face of the membrane opposite to said one of the faces, such that at least beyond a given pressure said transmission device and the membrane are movably integral with each other, and such that the transmission device transmits to the detector, in an amplified manner, the deformation or the stress from the deformation of the membrane.

31 Claims, 18 Drawing Sheets

(56) References Cited

U.S. PATENT DOCUMENTS

| | | | |
|---|---|---|---|
| 5,573,679 A | | 11/1996 | Mitchell et al. |
| 5,824,910 A | * | 10/1998 | Last et al. ............... 73/715 |
| 6,100,524 A | * | 8/2000 | Yagi et al. ............... 850/53 |
| 8,316,718 B2 | * | 11/2012 | Lin et al. ............... 73/718 |
| 8,387,464 B2 | * | 3/2013 | McNeil et al. ............... 73/718 |
| 2004/0168519 A1 | * | 9/2004 | Kalvensten et al. ............... 73/727 |
| 2008/0079444 A1 | * | 4/2008 | Denison ............... 324/679 |
| 2014/0318906 A1 | | 10/2014 | Deimerly et al. |

FOREIGN PATENT DOCUMENTS

| | | |
|---|---|---|
| FR | 2 674 627 A1 | 10/1992 |
| FR | 2 687 783 A1 | 8/1993 |

OTHER PUBLICATIONS

WP Eaton, et al., "Micromachined pressure sensors: review and recent developments", Smart Mater. Struct. 6, 1997, pp. 530-539 (plus cover page).

Masayoshi Esashi, et al., "Vacuum-Sealed Silicon Micromachined Pressure Sensors", Proceedings of the IEEE, vol. 86, No. 8, Aug. 1998, pp. 1627-1639.

Kang Ryeol Lee, et al., "Fabrication of capacitive absolute pressure sensor using Si—Au eutectic bonding in SOI wafer", Journal of Physics: Conference Series 34, 2006, pp. 393-398.

Ching-Liang Dai, et al., "Capacitive Micro Pressure Sensors with Underneath Readout Circuit Using a Standard Cmos Process", Journal of the Chinese Institute of Engineers, vol. 26, No. 2, 2003, pp. 237-241.

P. Rey, et al., "A High Density Capacitive Pressure Sensor Array for Fingerprint Sensor Application", Transducers '97, 1997, pp. 1453-1456.

M.Z. Shaikh, et al., "Performance Analysis of Piezoresistive MEMS for Pressure Measurement", Journal of Theoretical and Applied Information Technology, 2005, pp. 227-231.

Lynn F. Fuller, et al., "Bulk Micromachined Pressure Sensor", Proceedings of the IEEE UGIM Conference, Jun. 2003, pp. 317-320.

P.K. Kinnell, et al., "Advances in Silicon Resonant Pressure Transducers", Procedia Chemistry, vol. 1, Sep. 2009, pp. 104-107.

Zheng Cui, et al., "Modelling and Experiment of a Silicon Resonant Pressure Sensor", Analog Integrated Circuits and Signal Processing, 32, 2002, pp. 29-35.

U.S. Appl. No. 13/682,847, filed Nov. 21, 2012, Robert et al.

* cited by examiner

PRESSURE MEASUREMENT DEVICE HAVING AN OPTIMIZED SENSITIVITY

TECHNICAL FIELD AND PRIOR ART

The present invention relates to pressure sensors having an optimized sensitivity, the sensors being of the MEMS (Microelectromechanical Systems) and/or NEMS (Nanoelectromechanical Systems) type.

A pressure sensor is conventionally made of an embedded membrane capable of deformation under a pressure difference which is exerted between its two faces. In the case of an absolute pressure sensor, the membrane separates a reference volume under vacuum from the external medium to be measured. The membrane then more or less deforms as a function of the external pressure.

The deformation the membrane can be detected and measured by different techniques.

One of them is of the capacitive type. The deflection of the membrane is determined by measuring the variation in the capacitance of the capacitor formed between the membrane and a fixed counter-electrode facing it. The membrane is made on a first substrate and the counter-electrode is formed on a second substrate, and then both substrates are sealed under vacuum. The capacitor air gap distance is thus determined by the sealing air gap, which is hard to perfectly control.

Another detection technique implements piezoresistive gauges, the gauges are then directly provided on the membrane, the latter being then directly deformed by the deformation of the membrane.

Another detection technique implements a resonator, for example of the suspended beam or diapason type. This technique consists in measuring a variation in the resonant frequency of the resonator. The deflection of the membrane under the effect of the pressure generates a strain on a resonator directly attached to the membrane, which results in changing its resonant frequency. The measurement of the frequency offset accordingly enables the pressure to be retrieved.

The pressure sensors regardless of the detection technique used do not provide an optimized sensitivity. Furthermore, they do not enable an easy differential detection.

Further, from a manufacturing method point of view, the technology implemented to make the MEMS pressure sensors is generally far from that used for making inertial sensors in surface technology. As a result, there is thus hardly possible co-integration of these two types of sensors.

Document EP 0 143 738 describes a pressure sensor comprising a suspended membrane provided with an extra thickness on which measurement gauges are formed, these gauges being not anchored on two independent elements. The extra thickness is flexure deformed with the membrane, which deforms the gauges. The gauges are provided on the rotation axis. This sensor does not provide an optimized sensitivity

DESCRIPTION OF THE INVENTION

Consequently, one object of the present invention is to provide a MEMS and/or NEMS type pressure measurement device allowing an optimized sensitivity.

The previously set out object is achieved by a MEMS and/or NEMS pressure measurement device comprising a membrane defining together with a substrate a cavity and an element for transmitting the deformation of the membrane movably rotatably mounted at a first end of the substrate about an axis substantially parallel to the membrane and made integral with the membrane at a second end and one or more detectors of the rotation movement of the transmission element provided at the first end of the transmission element, the one or more detectors can be of the suspended strain gauge type (that is a gauge suspended in space by its two ends), of the capacitive type or of the resonant type. The transmission element forms a lever arm, the effect on the one or more detectors is thus amplified, which enables the sensitivity of the pressure sensor to be optimized. The sensor thus made can have improved performances, or a reduced size for an equal performance.

Furthermore, the membrane and the one or more detectors are decoupled, the one or more detectors being not directly on the membrane, it then becomes possible to optimize the membrane and the one or more detectors separately.

Further, it is relatively easy to make differential measurements regardless of the detector type used.

In other words, a lever arm is used which enables the signal emitted by the membrane to the detector(s) to be transmitted and amplified and the membrane and the one or more detectors to be geographically and mechanically decoupled.

The pressure sensor according to the invention can then be made with manufacturing technologies for MEMS or NEMS inertial sensors in surface technology, it then becomes easy to associate different types of sensors on a single substrate.

Thus, one subject-matter of the present invention is a MEMS and/or NEMS pressure measurement device comprising at least one deformable membrane suspended on a substrate, one of the faces of the membrane being intended to be subjected to the pressure to be measured, means for detecting the deformation of the membrane, said detection means being provided at least partly on the substrate and means for transmitting the deformation of the membrane, to the detection means, said transmission means being non-deformable, said transmission means being suspended above the membrane, said transmission means being rotatably hinged to the substrate about an axis substantially parallel to the plane of the membrane and being provided facing a face of the membrane opposite to the face intended to be subjected to the pressure to be measured so that at least beyond a given pressure, said transmission means and the membrane are movably integral with each other and such that the transmission means transmit to the detection means, in an amplified manner, the deformation or the stress from the deformation of the membrane.

By "non-deformable transmission means", it is meant transmission means, for example a beam, having a stiffness higher than at least 10 to 100 times the stiffness of the membrane and the detection means.

Furthermore, the displacement of the membrane corresponds to its deformation under the effect of pressure.

By rotation, it is meant a movement of the arm derived from a torsion, obtained for example by a torsion biased beam, or a movement of the arm derived from a flexure, for example from a flexure beam, a flexure of the beam following part of the rotation of said arm.

In one embodiment, the transmission means are integral with the membrane advantageously in a maximum deformation area of the membrane.

In another embodiment, a spacing is provided between the second end of the arm and the membrane for a pressure lower than the given pressure.

For example, the transmission means comprise at least one longitudinal arm comprising at least one first end at which the detection means are located and another end at which the arm is integral with the membrane.

In an exemplary embodiment, the longitudinal arm is integral with the membrane through a link being flexible along the longitudinal axis of the arm and rigid along an axis of deformation of the membrane.

According to one embodiment, the transmission means comprises at least one torsion beam connecting the first end of the longitudinal arm to the detection means, orthogonal to the longitudinal arm, the rotation axis being formed by said torsion beam which is secured on the one hand to the first end of the arm and on the other hand, to the substrate and the detection means.

The torsion beam can have a variable cross-section. Advantageously, the cross-section of the torsion beam is greater in the vicinity of the securings to the detection means than in the vicinity of the securings to the substrate, which enables said securings to be rigidified.

In another embodiment, the transmission means comprise at least one flexure beam substantially parallel to the longitudinal arm, the flexure axis being formed by said flexure beam which is secured on the one hand to the longitudinal arm and on the other hand to the substrate. Advantageously, the cross-section of the flexure beam is lower than that of the transmission arm.

In a particularly interesting exemplary embodiment, the longitudinal arm has a "U" pattern, said pattern comprising two ends corresponding to said first ends of the arm, the latter being respectively connected to the detection means through side extension beams.

The flexure beam could be contemplated to comprise a single first end provided with a single side extension beam.

According to an additional characteristic, the device can comprise means for rigidifying the membrane. The rigidifying means form for example extra thickness areas on the membrane, for example provided radially or as a honeycomb.

According to another additional characteristic, the device can comprise a counterweight attached to the arm at the first end of the arm.

According to another additional characteristic, the device can comprise several deformable membranes subjected to the same pressure, the transmission means being integral with all the membranes.

According to another additional characteristic, the device can comprise a stop provided facing the membrane opposite the face of the membrane which is subjected to the pressure so as to restrict the deformation thereof.

According to another additional characteristic, the device can comprise a cap on the substrate on the substrate and defining a cavity about the membrane opposite the face subjected to the pressure to be measured.

For example, the face of the membrane which is subjected to the pressure to be measured and the environment the pressure of which is to be measured can be communicated through the cap and/or between the cap and the substrate.

According to an embodiment, the detection means comprise at least one suspended strain gauge connected by one end to the substrate through a anchor pad and by another end to the torsion beam or to the transmission arm.

For example, the strain gauge is selected from a piezoresistive gauge, a piezoelectric gauge and a resonant gauge called a resonator.

In an exemplary embodiment, the detection means can comprise two strain gauges attached by one end to the torsion beam on either side thereof and by another end to the substrate through anchor pads. Advantageously, these gauges are symmetrically provided with respect to the transmission arm. Alternatively, the gauges can also be provided on the same side.

In another exemplary embodiment, the detection means comprise two strain gauges attached by one hand to at least one of the first ends of the transmission arm in the vicinity of and preferably as close as possible to the torsion axis on either side thereof and by another end to the substrate by anchor pads.

Advantageously, the anchor pads comprise an electrical contact.

In another embodiment, the detection means comprise at least one resonator connected by a first end to the torsion beam and by another end to a anchor pad on the substrate, means for exciting the resonator and means for detecting the resonant frequency of the resonator.

In another embodiment, the detection means are of the variable capacitance type. For example, the detection means comprise at least one first fixed electrode on the substrate and at least one first movable electrode integral with the transmission means and facing the fixed electrode.

The pressure measurement device can comprise second fixed electrodes and second movable electrodes, said second electrodes being located opposite the first electrodes with respect to the rotation axis so as to form a differential measurement device.

In an exemplary embodiment, the cavity is tight. For example, a vacuum is made in said tight cavity to form an absolute pressure sensor. A getter material can be deposited onto the cap at the cap area being located above the membrane and/or on the substrate facing the cap.

In another exemplary embodiment, the cavity is connected to the external environment to form a relative pressure sensor or a microphone. The connection between the cavity and the external environment can be made by means of a vent formed through the cap or between the cap and the substrate.

One subject-matter of the present invention is also to provide a MEMS and/or NEMS assembly comprising at least one pressure measurement device according to the present invention and at least one inertial sensor made on and in the same substrate.

Another subject-matter of the present invention is a method for manufacturing a pressure measurement device according to the present invention, comprising the steps of:

a) making the different elements of the sensor except for the cap by depositing and etching on a substrate, b) making the cap on the substrate or transferring and sealing the cap on the substrate, c) releasing the membrane.

The sealing of the cap on the substrate occurs for example under vacuum.

During step a) or b, the method can comprise a substep of depositing a getter material on an inner face of the cap and/or the substrate.

The reconnections are for example made by means of vias in the front face and/or in the back face.

Another subject-matter of the present invention is a manufacturing method of a set of sensors comprising the steps of the method according to the present invention, wherein in step a), at least one inertial sensor is simultaneously made.

BRIEF DESCRIPTION OF THE DRAWINGS

The present invention will be better understood using the following description and the appended drawings wherein:

FIG. 17A' is a longitudinal cross-section view of another exemplary sensor according to the invention with strain gauge detection, allowing the static pressure compensation and/or self-calibration and/or self-test of the pressure sensor;

DETAILED DESCRIPTION OF PARTICULAR EMBODIMENTS

In the description that follows, the sensors are of the NEMS and/or NEMS type, however they will only be designated by the term "sensor" for simplicity.

Elements and parts having the same function and the same shape will be designated by the same reference numbers.

Figure 1A:
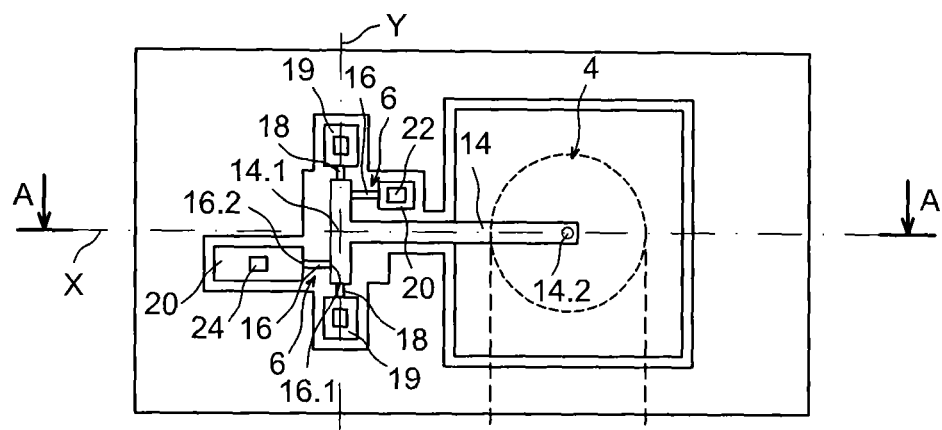
FIGS. 1A and 1B are a top view and a cross-section view along the line A-A respectively of an exemplary embodiment of a pressure measurement device with suspended strain gauge detection according to the invention, FIG. 1A' is an alternative embodiment of FIG. 1A, wherein the rotatable hinge is made by a flexure deformable beam, FIG. 1B' is a perspective view of an alternative embodiment of FIG. 1A', wherein a hinge being flexible along the axis X and rigid along the axis Z between the membrane and the transmission arm is made.
Figure 1B:
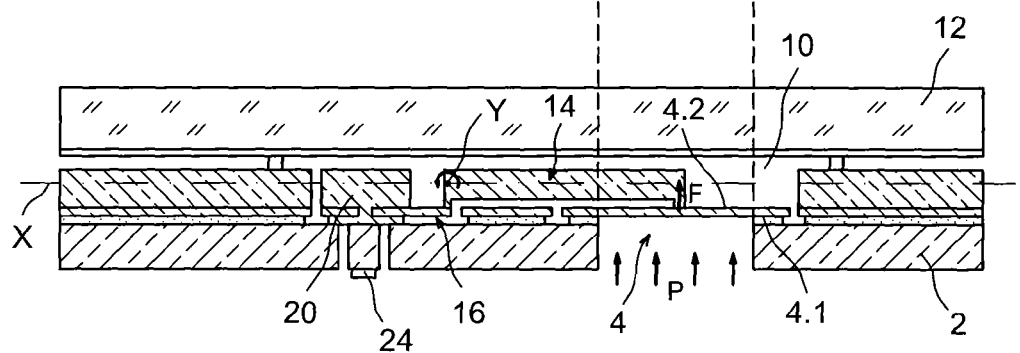
Figure 1A:
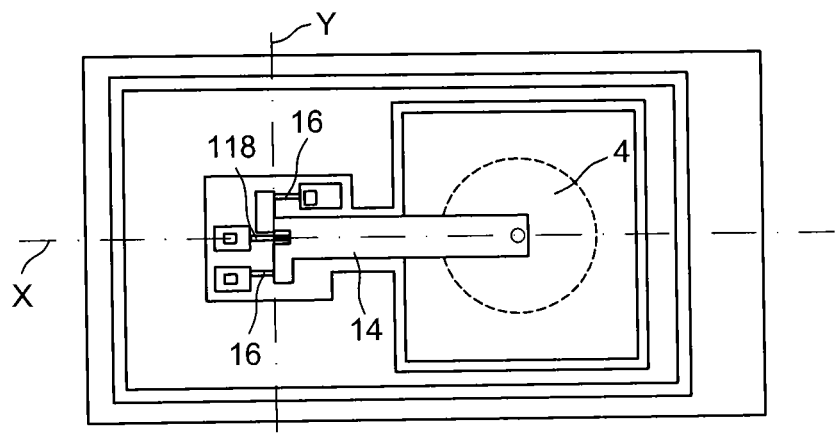
Figure 1B:
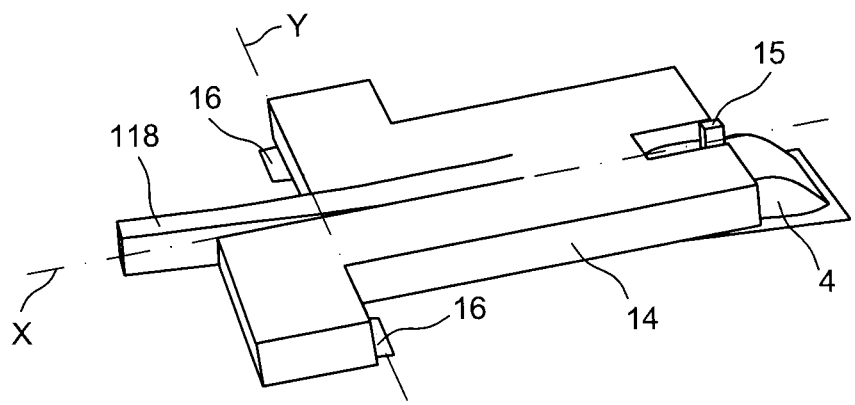

FIGS. 1A and 1B are a top and a cross-section view respectively of an exemplary embodiment of a pressure sensor, comprising a substrate 2, a membrane 4 suspended on the substrate, the membrane being such that it deforms under the action of a pressure difference on its both faces, means 6 for detecting the deformation of the membrane located on the substrate and means capable of transmitting the deformation of the membrane 4 to the detection means 6.

In the present application, by "substrate" for simplification, it is intended the support substrate 2 and layers provided on this support substrate such as for example the layer(s) wherein the membrane and the transmission arm are made.

The membrane 4 is subjected on one of its faces 4.1 to the pressure P desired to be measured, in the representation of FIG. 1B, it is the lower face of the membrane. The other face 4.2 is subjected to a reference pressure which is made in a cavity 10 formed between the membrane 4 and a cap 12. In the case of an absolute pressure sensor, a vacuum is made in the cavity 10. The cap 12 is sealed on the substrate 2 either by means of a sealing bead 13 or by direct sealing, of the beadless type.

In the example represented, the membrane 4 is in a disk shape (in dotted line in FIG. 1A) but it could have any other shape, such as a square, hexagonal shape . . . .

The means for transmitting the deformation of the membrane 4 to the detection means 6 are formed by an arm 14 having a longitudinal axis X, movably rotatably mounted with respect to the substrate at a first longitudinal end 14.1, the rotation axis Y is substantially parallel to the membrane and the plane of the substrate. Furthermore, the arm 14 is made movably integral with the membrane at its second longitudinal end 14.2. The arm is non-deformable, that is it has a rigidity higher than at least 10 to 100 times the rigidity of the membrane and the transmission means. The arm 14 is suspended above the membrane 4, i.e. it is located above the membrane and an air gap exists between the arm 14 and the membrane, the sole contact between the arm 14 and the membrane 4 is at the second longitudinal end 14.2 of the arm 14.

The arm has, in the example represented, the shape of a rectangular cross-section rigid beam. The beam could alternatively have a trapezoidal shape.

Preferably, the second longitudinal end 14.2 of the arm 14 is integral with the membrane at or close to the area having a maximum deformation. The movement of the arm about its rotation axis Y seen by the detection means is then maximum and the sensor sensitivity is therefore optimized.

Of course, the part of the arm 14 which is integral with the membrane could be another part than the second longitudinal end 14.2, between the first 14.1 and second 14.2 longitudinal ends.

The detection means 6 are provided on the substrate such that they detect the movement of the first longitudinal end 14.1 of the arm, this movement being proportional to the deformation amplitude of the membrane 4. Since the arm 14 forms a lever arm, the stress seen by the detection means 6 is amplified with respect to the membrane deformation. In the case of a gauge measurement, the lever arm increases the stress exerted onto the gauges but decreases the deformation amplitude with respect to the deformation amplitude of the membrane due to the law of conservation of momentum.

In an embodiment represented in FIG. 1A, the pivot link of the axis Y is formed by a beam 18 with the axis Y torsion biased about the axis Y. The beam is anchored at each of its ends on the substrate. In the following description, the beam 18 will be designated "torsion axis 18". Advantageously, this beam 18 comprises a flexure rigid part along the axis X for transmitting all the stress and on which the gauges are attached, and a torsion axis forming part at its ends which is also flexure rigid along the axis X of the stress.

In another embodiment and as represented in FIGS. 1A' and 1B', the rotation hinge could be formed by one or several flexure biased beams 118 having an axis parallel to that of the arm 14. In FIG. 1B' the beam 118 can be seen in a flexure state, furthermore, in this alternative, a link 15 being flexible along the axis X and rigid along the axis Z between the membrane and the transmission arm 14 is performed similarly to the embodiment of FIG. 3. Preferably, the transmission element is substantially U shaped, the bottom of the U being made integral with the membrane 4 and the free ends of the two branches forming the first ends and biasing the detection means.

In the device represented in FIGS. 1A and 1B and 1A' and 1B', the detection means 6 are formed by two suspended strain gauges 16 each attached by a first end 16.1 on the torsion axis 18 and by a second end 16.2 to a anchor pad 20 to the substrate 2. The stress amplified by the arm 14 is then applied on the longitudinal end of the gauges.

The stiffness of the beam 18 in the transversal direction with respect to the axis Y is preferably at least larger than 10 times the stiffness in compression of the gauge(s), which avoids the deformation of the beam 18 and a reduction of the deformation which is transmitted to the beam.

The gauges 16 are provided on either side of the rotation axis and of the arm 14.

The detection means may only comprise a single strain gauge. The implementation of two strain gauges enables differential measurements to be made, making the device less thermally sensitive.

On the anchor pads of the gauges are formed electrical contacts 22, 24. On one of the pads 20, the electrical contact 24 is made in the back face of the substrate 2, on the deformable membrane side, and can be used to bias the strain gauge 16. The contact is connected to the gauge by means of a via or TSV (Through Silicon Vias) or through the anchor pad 20.

The strain gauges can be of piezoelectric material or piezoresistive material.

The gauges are directed such that their sensitive axis is substantially parallel to the link arm and thus, such that it is substantially orthogonal to the rotation axis of the link arm. Besides, the neutral line of each gauge is provided above or below the rotation axis of the transmission arm. For this, the gauges can have a lower thickness than that of the torsion and/or flexure beam. For example, to obtain this thickness lower from the same layers, an extra thickness can be deposited on said beams.

The operation of the pressure sensor of FIGS. 1A and 1B will now be explained.

When a pressure difference appears between the face 4.2 of the membrane 4 which is in contact with the inside of the cavity 10, which is at the reference pressure, and the face 4.1 of the membrane, which is in contact with the environment the pressure of which is desired to be measured, the membrane deforms. The deformation occurs either inwardly from the cavity, or outwardly from the cavity depending on the pressure value to be measured with respect to the reference pressure.

This deformation induces a force on the arm 14 integral with the membrane, which results in generating a stress in the strain gauges 16. This stress is amplified due to the arm and its pivoting about the axis Y. The stress undergone by the gauges 16 is then measured for example by measuring the variation in electrical resistance of the gauges in the case of piezoresistive gauges. These measurements then enable the pressure difference seen by the membrane and the pressure of the environment to be determined.

The amplification of the stress by the lever arm will be all the higher since the arm length between the point of application of the force by the membrane and the rotation axis Y will be great, that the rotation axis will be close to the point of application of the stress on the gauge. The stress will also be all the higher since the cross-section of the gauge (thickness, width) will be small.

Thus, the sensitivity of the sensor is increased. It is thus possible to provide more efficient sensors or then to reduce the size of sensors, for example by reducing the area of the membrane, while preserving the same performance.

Figure 2A:
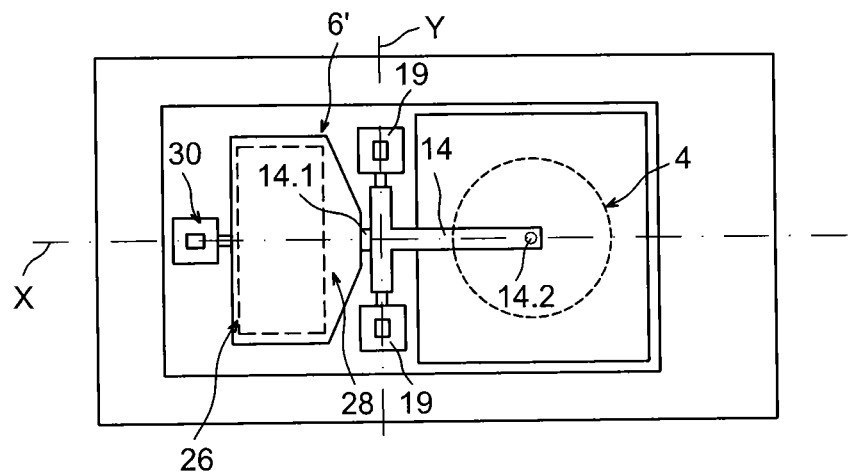
FIGS. 2A and 2B are a top view and a longitudinal cross-section view respectively of an exemplary embodiment of a pressure measurement device with capacitive detection according to the invention.
Figure 2B:
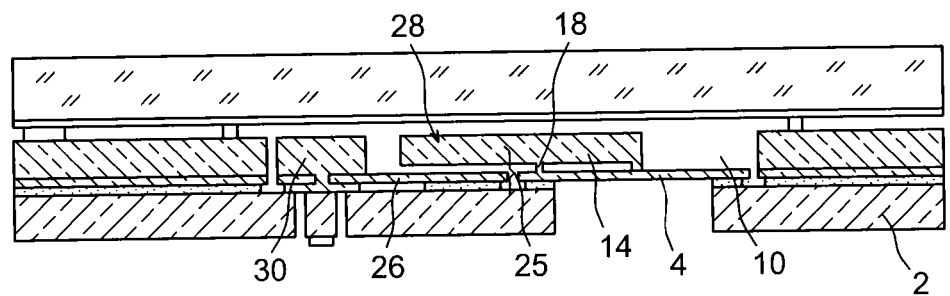

In FIGS. 2A and 2B a pressure sensor according to the present invention can be seen wherein the detection is made by capacitive means.

The detection means 6' are of the capacitive type that is the detection is obtained through measurement of a variation in the capacitance of a capacitor 25. The detection means 6' comprise a fixed electrode 26 located on the substrate 2 and a movable electrode 28 integral with the arm 14, and facing the fixed electrode 26. The movable electrode 28 is attached to the first end 14.1 of the arm 14. The fixed electrode 26 is connected to a contact 30 and the movable electrode is connected to the electrical contact formed on one of the anchor pads of the torsion axis 18.

When the membrane 4 is deformed, the arm 14 drives the movable electrode 28 therewith, which moves with respect to the fixed electrode 26. The air gap distance between both electrodes 26, 28 varies, this variation is representative of the deformation of the membrane 4 and thus of the environment pressure.

Thanks to the implementation of the arm 14, the displacement of the movable electrode 28 can be amplified with respect to that of the membrane 4. Thus, for a given pressure, the variation in capacitance is increased. The sensitivity of the pressure sensor is thus increased.

Figure 3:
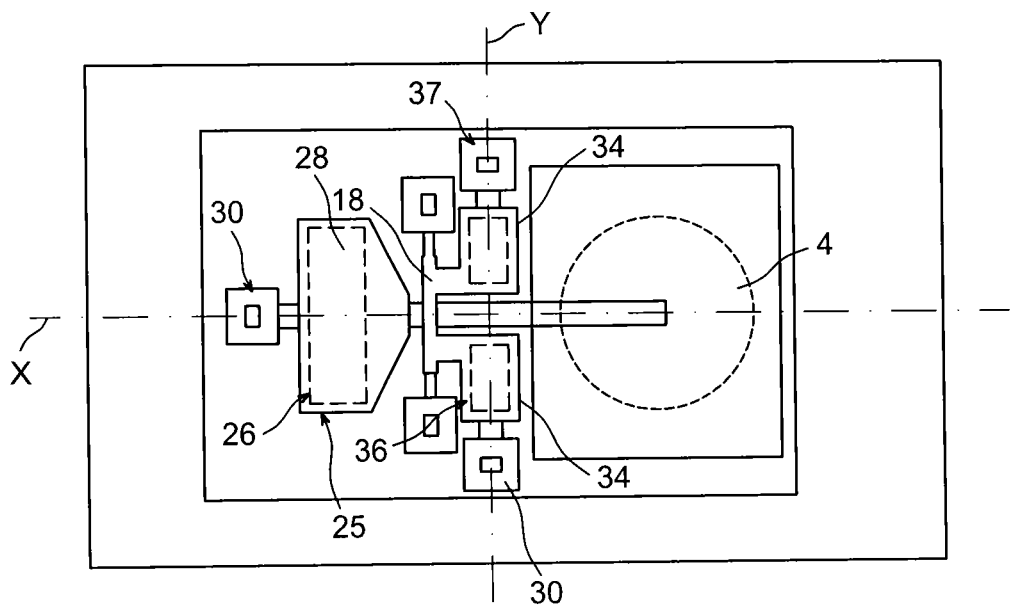
FIG. 3 is a top view of an exemplary embodiment of a pressure measurement device implementing differential capacitive measurements.

In FIG. 3 an exemplary embodiment of a pressure sensor with capacity detection can be seen, allowing a differential measurement.

This sensor differs from that of FIGS. 2A and 2B, in that it comprises at least one additional variable capacitance capacitor 32 to enable a second capacitance variation to be measured. In the example represented, these are two additional capacitors 32, thus the movable electrodes 34 are located between the torsion axis 18 and the membrane 4 and are connected to the torsion axis 18 on either side of the arm 14. Fixed electrodes 36 (represented in dotted lines) are located facing the movable electrode 34 on the substrate 2. The fixed electrodes 36 are connected to contact pads 37 and 30.

It is to be noted that when the capacitance of the capacitor 25 increases, that of the additional capacitors 32 decreases. Preferably, the distance between the torsion axis 18 and the electrode 28 is the same as that between the torsion axis and the electrodes 34 for them to see the same amplification. To obtain a differential measurement, the area of the electrode 28 is chosen equal to the sum of areas of both electrodes 34.

Figure 4:
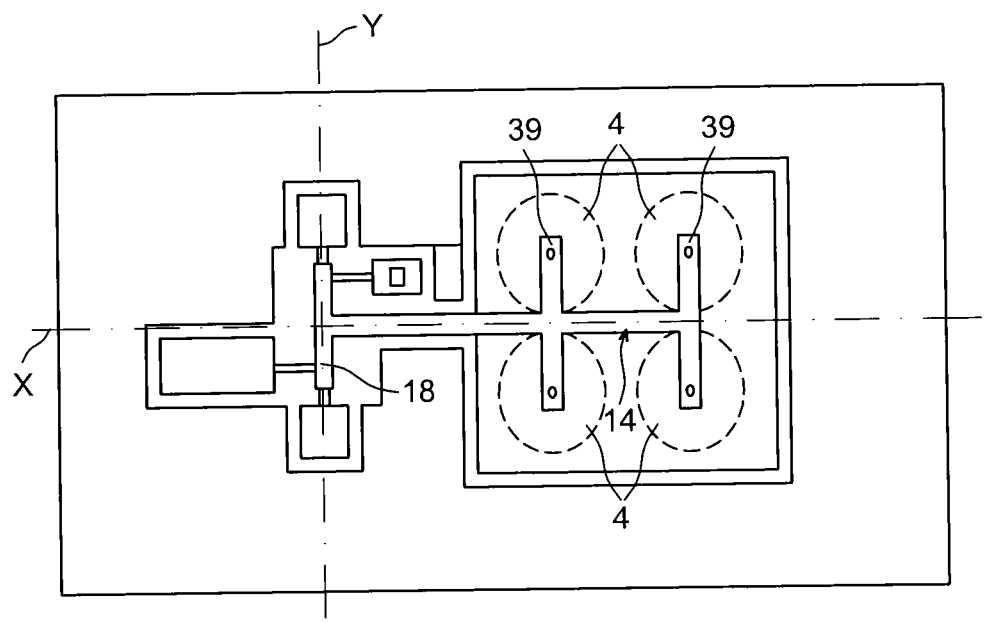
FIG. 4 is a top view of another exemplary embodiment of a pressure measurement device with strain gauge detection comprising several membranes.

In FIG. 4 an alternative embodiment of the pressure sensor of FIGS. 1A and 1B can be seen, comprising several membranes 4, the arm 14 being connected to each of the membranes 4. In the example represented, two membranes are provided on each side of the axis X, and the arm comprises two parallel transverse elements 39, extending on either side of the arm 39 and connected at the vicinity of their ends to the membrane 4.

Deformations of four membranes 4 apply a strain on the arm 14, but the total area of the four membranes is higher than that of a single membrane, the force applied on the arm and thus on the gauges is increased. This embodiment is particularly interesting for the strain gauge sensors, such as piezoresistive or resonant gauges.

Figure 5A:
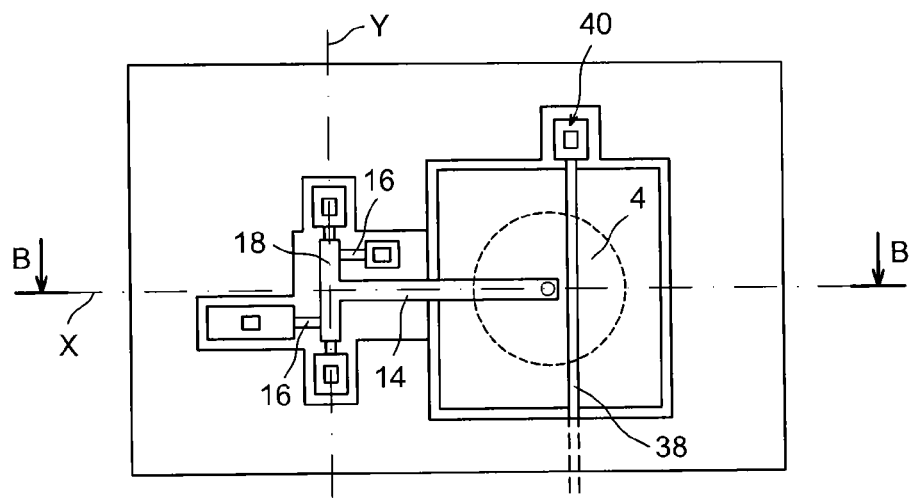
FIGS. 5A and 5B are a top view and a cross-section view along the line B-B respectively of another exemplary embodiment of a pressure measurement device with strain gauge detection according to the invention, having a mechanical stop capable of limiting the overpressure risk that may damage the sensor.
Figure 5B:
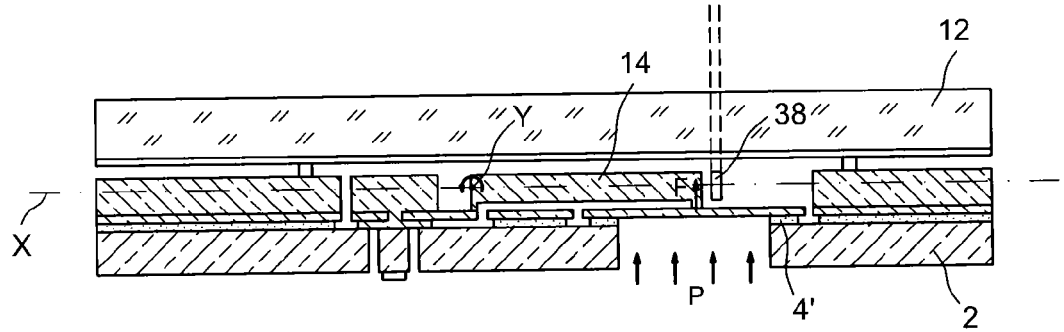

In FIGS. 5A and 5B another alternative embodiment of the pressure sensor of FIGS. 1A and 1B can be seen. The sensor comprises stop means 38 provided between the membrane 4 and the cap.

The stop 38 is used to restrict the movement of the membrane 4, and thus that of the arm 14, to protect the gauges 16. Indeed, in the case of pressure chock, the pressure seen by the membrane can fall outside the measurement range provided during manufacturing, and the membrane 4 via the arm 14 can apply a stress higher than the stress the gauge(s) 16 can resist.

It is possible to simply set the pressure level from which the movement of the membrane and thus that of the arm is restricted, by positioning the stop 38 more or less close to the membrane area having a maximum deformation.

It can be contemplated that the stop be above the arm and directly form a stop for the arm, for example in the case where the stop is directly made by the cap 12 or on the cap above the arm.

An electrical contact 40 can be added on the anchor pad of the stop in order to control the stop potential, for example the stop could be at the potential of the membrane, which enables a short circuit risk to be avoided in the case of a contact of the membrane with the stop and the risk of a parasitic electrostatic attraction of the membrane to the stop.

Figure 6A:
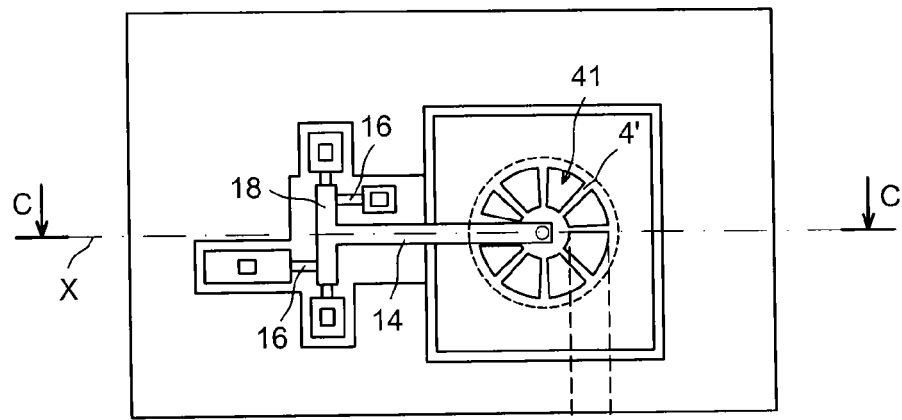
FIGS. 6A and 6B are a top view and a cross-section view along the line C-C respectively of another exemplary embodiment of a pressure measurement device with strain gauge detection according to the invention, having a localized rigidification of the deformable membrane.
Figure 6B:
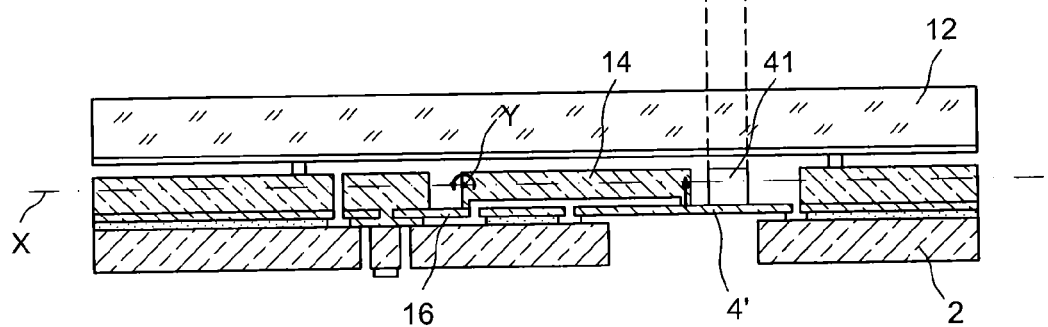

In FIGS. 6A and 6B another alternative embodiment of the pressure sensor of FIGS. 1A and 1B can be seen. The membrane 4' has a locally increased rigidity in order to reduce the deformation of the membrane 4 for the benefit of the stress applied on the arm 14 and on the gauge(s) 16.

In the example represented, the membrane 4 is locally rigidified by adding radial extra thicknesses 41 on the membrane 4, having a structure similar to umbrella ribs. A honeycomb structure can also be suitable as well as any other means increasing the membrane rigidity. The rigidification level is selected in order to avoid making the sensor too sensitive to accelerations.

Figure 7:
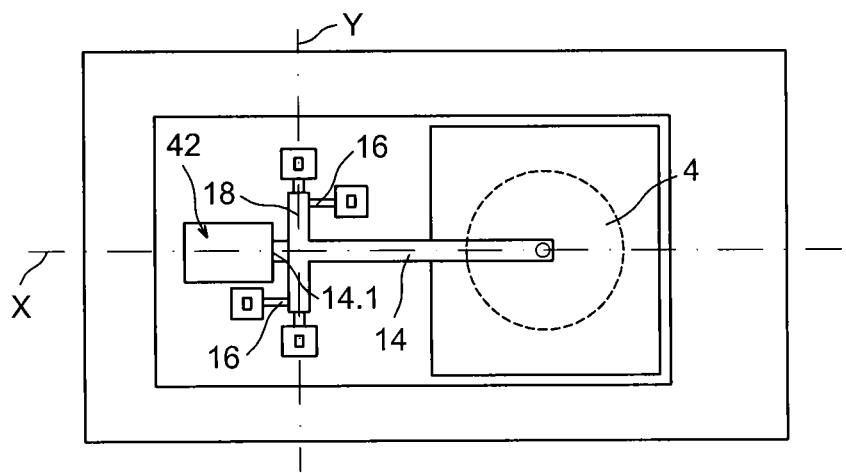
FIG. 7 is a top view of another exemplary embodiment of a pressure measurement device with strain gauge detection providing reduced sensitivity to accelerations.

In FIG. 7 another alternative embodiment of the sensor of FIGS. 1A and 1B can be seen, comprising a counterweight 42 attached to the arm 14 between the torsion axis 18 and the first longitudinal end 14.1 of the arm 14 and compensating for the weight of the arm 14 and/or the membrane 4.

Preferably and as represented in FIG. 7, the counterweight 42 is attached to the first end 14.1 of the arm 14. The counterweight 42 results in moving the centre of gravity of the membrane 4-arm 14 assembly to which is added the counterweight 42 towards the rotation axis Y, so that it is as close as possible to the rotation axis Y, or even on the rotation axis Y.

The pressure sensor is then less sensitive, or even insensitive to off-plane acceleration, that is to the acceleration tending to deflect the membrane.

Figure 8:
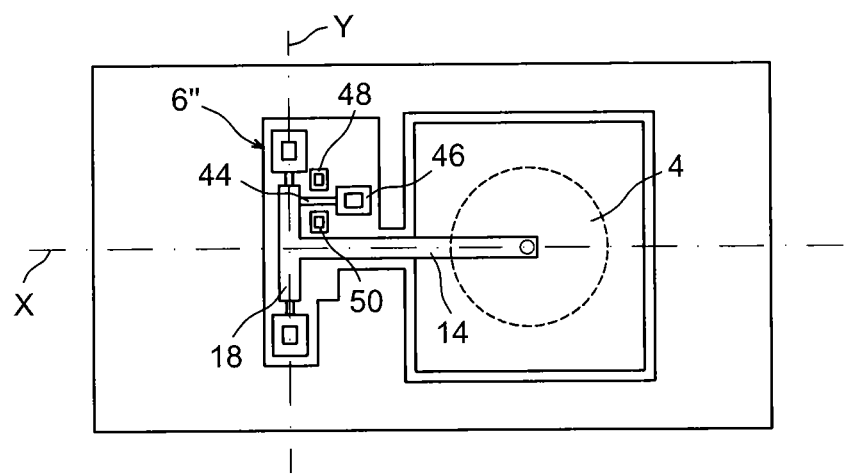
FIG. 8 is a top view of another exemplary embodiment of a resonant pressure measurement device.

In FIG. 8 another exemplary embodiment of a pressure sensor according to the invention can be seen, wherein the detection means 6" are of the resonant type. The detection means 6" comprise a resonator 44 suspended between the torsion axis 18 and a anchor pad 46 carrying an electrical contact, means 48 for exciting the resonator 44 and means 50 for detecting the variation in the resonant frequency of the resonator 44, that is of its resonant frequency. The excitation 48 and detection 50 means are for example of the capacitive type and are formed by electrodes. The resonator can be piezoelectric. The excitation and detection are thus achieved by electrodes provided on the resonator. A second resonator can also be provided on the other side of the axis Y.

The resonator has a reduced thickness with respect to the torsion axis 18 in order to be sensitive to the off-plane movement of the arm 14.

The operation of this sensor is the following: when the membrane 4 deforms, it applies a stress to the arm 14 which transmits it to the resonator 44. The latter is excited by the excitation means 48 and is vibrated at resonance. Due to the stress applied thereto, its resonant frequency varies, the variation is then measured by the detection means 50. It is thus possible to retrieve the membrane deformation and thus the environment pressure.

Figure 9:
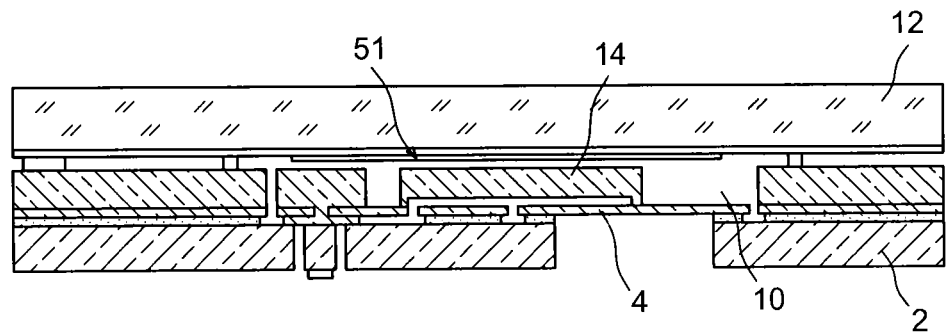
FIG. 9 is a longitudinal cross-section view of another exemplary embodiment according to the invention with strain gauge detection, comprising a getter layer.

In FIG. 9 still another alternative embodiment of the absolute pressure sensor can be seen comprising a getter material layer 51 provided in the cavity 10, for example deposited onto the face of the cap located inside the cavity 10. This layer 51 enables the vacuum to be stabilized and/or improved in the cavity 10, which improves the reliability and the performance of the sensor.

Figure 10:
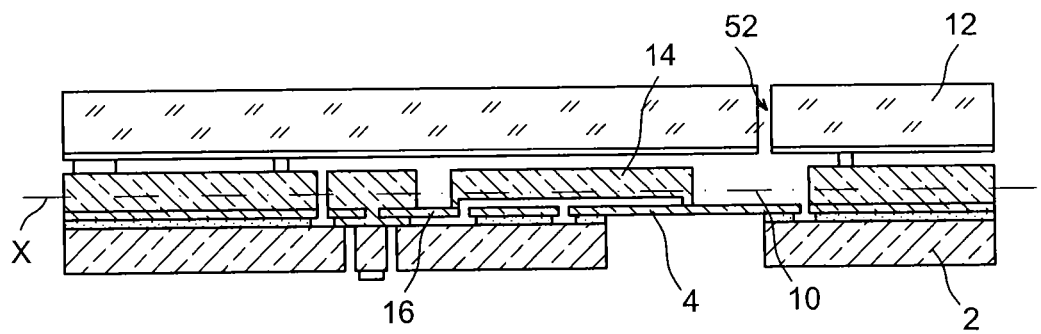
FIGS. 10 and 11 are longitudinal cross-section views of alternative embodiments of a relative pressure measurement device or a microphone according to the invention with strain gauge detection, provided with vent.
Figure 11:
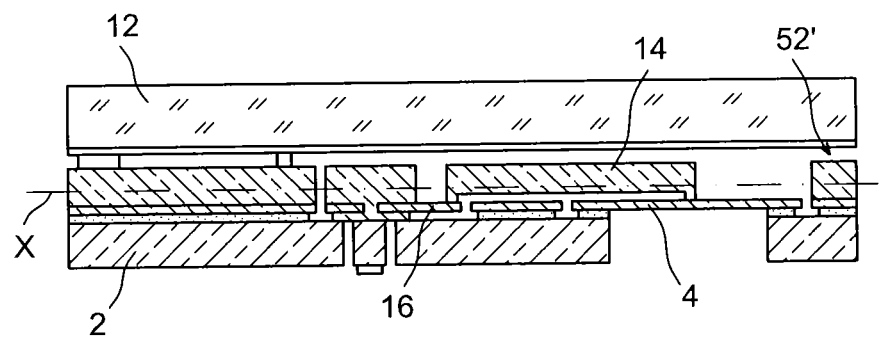

In FIGS. 10 and 11 another alternative of the pressure measurement device of FIGS. 1A and 1B can be seen in the case where the reference cavity is connected to the ambient pressure.

In FIG. 10, a vent 52 is preferentially directly made through the cap 12 for example through etching or laser drilling.

In FIG. 11, the vent 52' is laterally formed between the cap 12 and the substrate 4, for example through the sealing bead.

These devices can form a relative pressure sensor or a microphone.

Figure 12A:
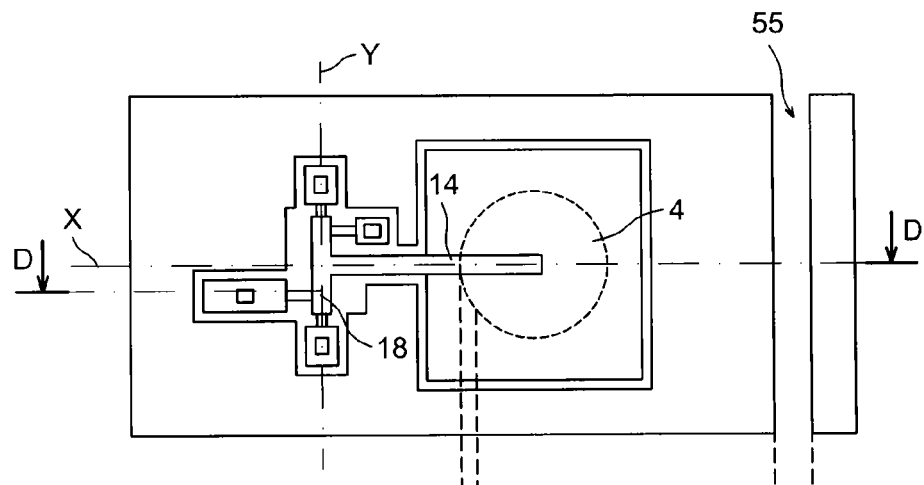
FIGS. 12A and 12B are a top view and a cross-section view along the line D-D respectively of an alternative embodiment of the pressure measurement device of FIGS. 1A and 1B.
Figure 12B:
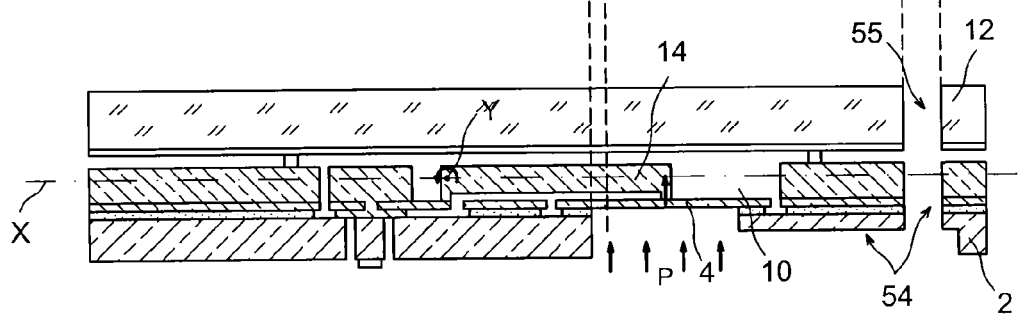

In FIGS. 12A and 12B yet another alternative embodiment of the pressure sensor of FIGS. 1A and 1B can be seen, wherein the lower face 4.2 of the membrane 4 is contacted with the pressure to be measured by the duct 54 formed in the substrate parallel to the plane of the substrate and a duct 55 formed through the cap 12 perpendicular to the plane of the cap and opening into the front face of the sensor. The duct 54 can be made when manufacturing the chip, for example a cutting line made by means of a saw or a laser.

Figure 13:
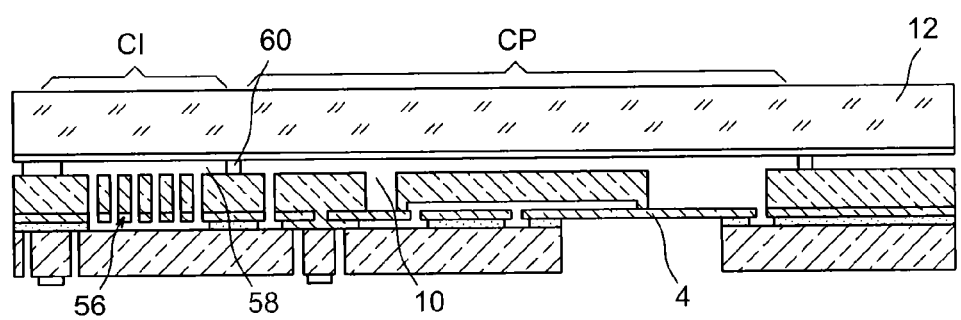
FIG. 13 is a longitudinal cross-section view of an assembly integrating a pressure measurement device according to the invention with strain gauge detection and an inertial sensor.

In FIG. 13 an exemplary integration of the pressure sensor according to the invention and an inertial sensor can be seen. This integration is made possible by the fact that the pressure sensor PS according to the invention can be made with inertial sensor technologies, such as accelerometers or gyrometers.

In FIG. 13 the pressure sensor PS can be seen (on the right on the representation of FIG. 13) as well as an inertial sensor IS (on the left on the representation of FIG. 13) comprising interdigitated capacitive combs 56, made in the same substrate as that of the pressure sensor.

In the example represented, the encapsulation of the inertial sensor IS is achieved by making a cavity 58 distinct from the cavity 10 of the pressure sensor, wherein a sealing bead 60 separates them. However, in the case of a closed cavity 10, a single cavity for both sensors PS and IS can be considered.

Figure 14:
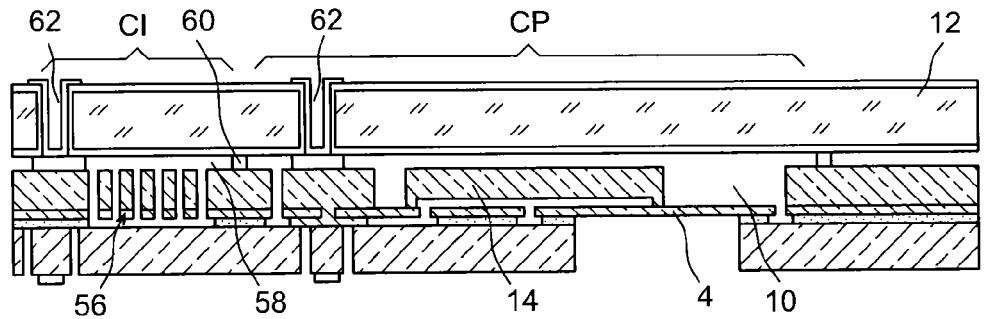
FIG. 14 is a longitudinal cross-section view of an alternative embodiment of the assembly of FIG. 13 this time with electrical contacts passing through the side opposite the membrane.

In FIG. 14 an exemplary integration of a pressure sensor PS and a inertial sensor IS can also be seen, wherein the reconnections are performed in the front face by vias (or TSV) through the cap in the front face, and not in the back face through the substrate as for the other examples.

Figure 16:
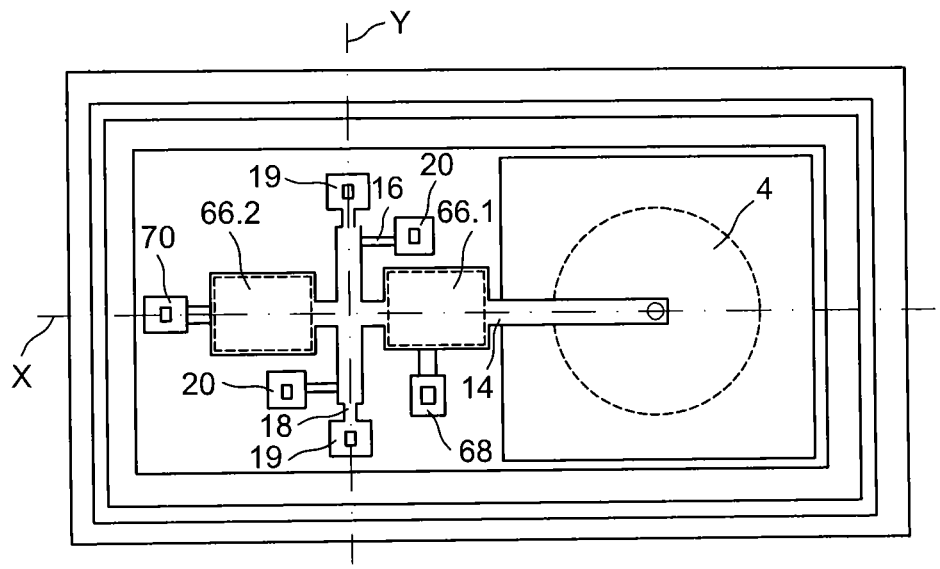
FIG. 16 is a top view of another exemplary sensor according to the invention with strain gauge detection, allowing a static pressure compensation and/or self-calibration and/or self-test of the pressure sensor.

In FIG. 16 another exemplary embodiment can be seen. The structure of the sensor is close to that of the sensor of FIG. 1A. The detection of the membrane deformation is achieved by means of piezoelectric gauges.

In the example represented, the pressure sensor comprises static pressure and/or self-calibration and/or self-test compensation of the pressure sensor.

The sensor comprises two pairs of electrodes 66.1, 66.2 having a capacitive actuation, the first one 66.1 being located between the rotation axis Y and the link with the membrane 4 and the other one 66.2 being located on the other side of the rotation axis Y. An electrode, called upper electrode, of each pair is located on the arm, and the other electrode, called lower electrode, of each pair is located on the substrate but electrically insulated from the substrate. The lower electrodes are represented in dotted lines.

The upper electrodes of each pair are electrically connected through the arm 14 and the pad 19. The contact pad 68 ensures the activation of the lower electrode of the pair 66.1 and the contact pad 70 ensures the activation of the lower electrode of the pair 66.2.

Upon activating electrodes 66.1, 66.2, electrostatic forces appear between the lower electrodes and the upper electrodes.

In the representation of FIG. 16, the activation of the electrodes 66.1 enables the arm to be moved upwards and the activation of the electrodes 66.2 enables the arm to be moved upwards and thus to act on the membrane deformation.

The activation of the electrodes 66.1 causes a pivoting of the arm 14 clockwise and a movement of the membrane towards the substrate 2, which enables all or part of the membrane deformation coming from this static pressure to be cancelled, to only measure the variations in pressure about this pressure.

For example, it can be requested to cancel about 0.5 time the atmospheric pressure.

This is particularly interesting in the case of a pressure sensor having to measure very small variations in pressure about a static pressure value.

An activation of the electrodes 66.2 causes a pivoting of the arm counter-clockwise and a movement of the membrane away from the substrate 2.

The activation of the actuating electrodes 66.2 enables self-tests to be performed. The smooth operation of the sensor can then be checked by deforming the membrane 4 upwards by the electrostatic actuating means of the pair of electrodes 66.2 and by checking that the detection means are sensitive to this induced deformation.

The activation of the actuation electrodes 66.2 also enables a self-calibration to be performed. In this case, the pressure sensor is calibrated by applying a known voltage between the actuating electrodes 66.2, inducing a deformation of the membrane which "simulates" a reference pressure, thus enabling the output signal from the sensor to be reset.

The detection means, for example piezoresistive gauges, are used to measure variations in pressure about this compensated static pressure.

A pressure sensor only comprising self-test and/or self-calibration means or static pressure cancelling means does not fall outside the scope of the present invention.

The implementation of these electrodes can enable the position of the arm and the membrane to be controlled, in particular in the case of a capacitive detection.

In an advantageous manner, the pair of electrodes 66.1 is located at the opposite of the rotation axis Y with respect to the membrane 4.

Figure 17A:
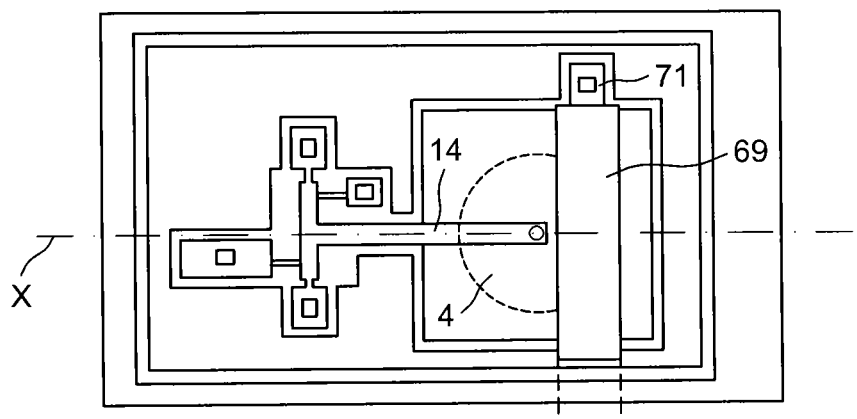
FIGS. 17A and 17B are a top view and a longitudinal cross-section view along the cross-section plane E-E of another exemplary sensor according to the invention with strain gauge detection, allowing the static pressure compensation and/or self-calibration and/or self-test of the pressure sensor.
Figure 17B:
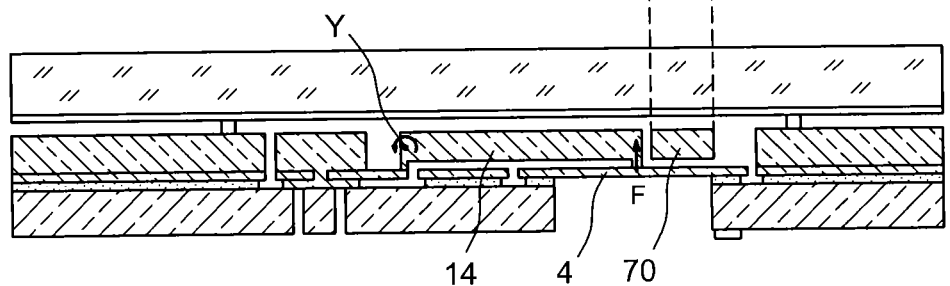
Figure 17A:
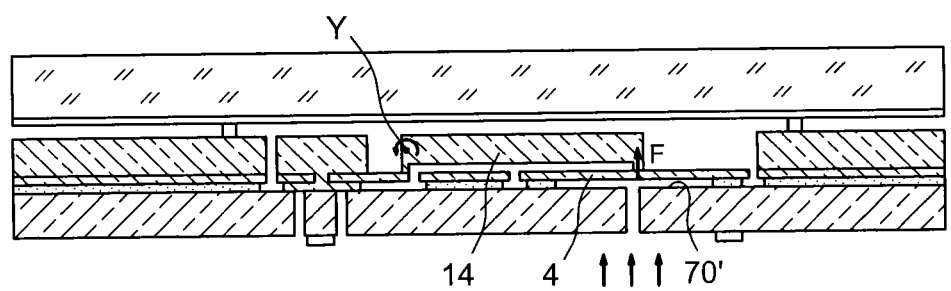

In FIG. 17 another exemplary embodiment of a pressure sensor comprising static pressure and/or self-calibration and/or self-test compensation means of the pressure sensor can be seen.

In this example, the actuation electrode is such that it can directly act on the membrane.

In FIGS. 17A and 17B, the actuating electrode 69 is located above the membrane, this being made in the MEMS layer. The electrode 69 is in the form of a beam extending perpendicular to the longitudinal axis X. In the example shown, the beam is embedded at one of its ends, the embedding 71 also forming an electrical connection. Alternatively, the electrode 69 can extend throughout the surface of the membrane. In an advantageous manner, the actuating electrode is embedded at its both ends.

In another example, the actuation electrode 70' can be located below the membrane 14 by using part of the substrate. For this, the cross-section of the pressure intake opening is reduced, which enables part of the substrate to face the membrane. This example is represented in FIG. 17A'.

Figure 18A:
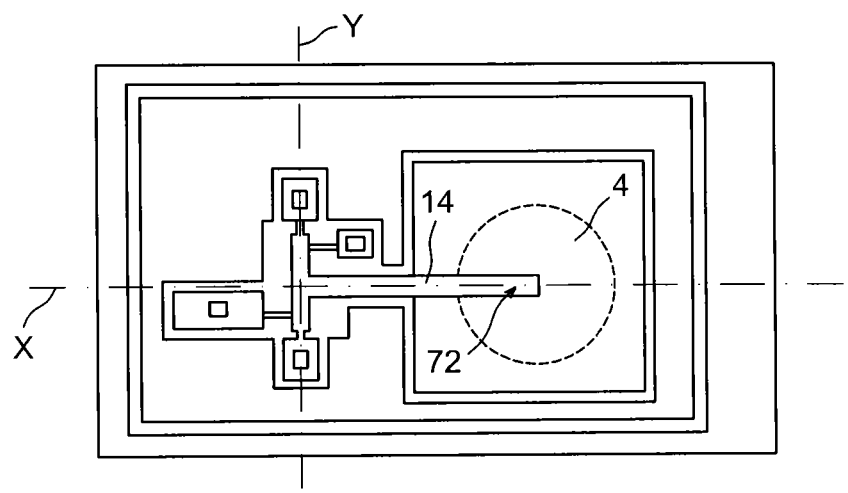
FIGS. 18A and 18B are a top view and a longitudinal cross-section view along the cross-section plane E-E of another exemplary sensor according to the invention with strain gauge detection, comprising passive static pressure compensation means.
Figure 18B:
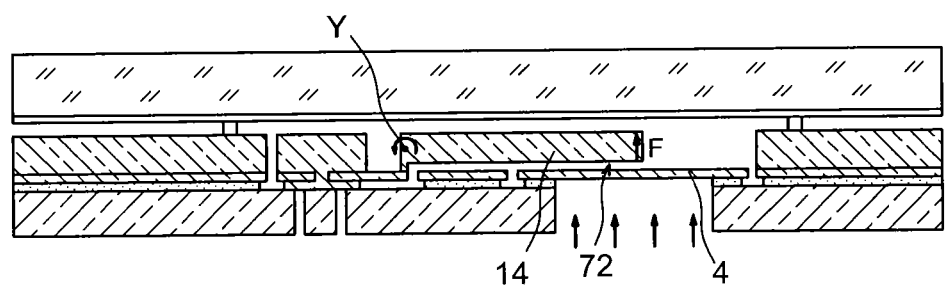

In FIGS. 18A and 18B a particularly interesting embodiment of a pressure sensor comprising passive static pressure compensation means can be seen.

In this exemplary embodiment, a spacing 72 is provided between the membrane and the end of the lever arm 14 for allowing a deformation of the membrane without an action on the arm 14 in an initial membrane deformation phase. The spacing 72 is determined depending on the proportion of static pressure to be compensated for. For example, it can be desired to compensate for 90% of this static pressure, therefore the gauges only see a stress beyond a pressure applied above 90% of the static pressure to be compensated for.

Thanks to this embodiment, the resolution of the pressure sensor can be increased by a factor 5 to 10.

Alternatively, the pressure sensor can comprise besides the spacing 72 a flexible mechanical link between the membrane and the amplifying arm. This flexible link is dimensioned to transmit substantially no stress to the gauges as long as the membrane is not in direct mechanical contact with the amplifying arm 14. This flexible mechanical link enables the membrane and the arm 14 to be at the same electrical potential regardless of the pressure. The flexible link is for example formed by a flexible beam or a spring.

Figure 19:
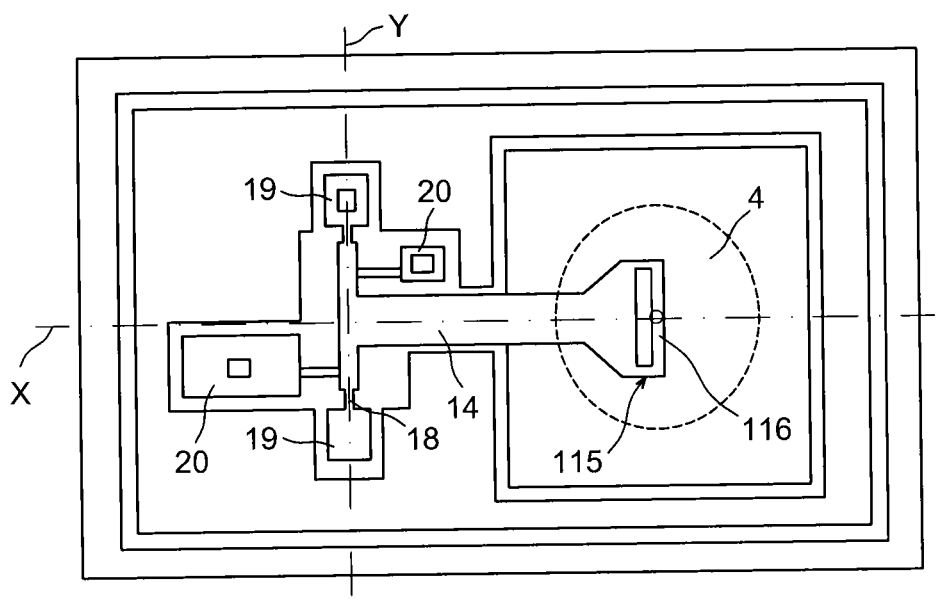
FIG. 19 is a top view of an exemplary embodiment of a pressure measurement device implementing piezoelectric measurements and comprising a hinge being flexible along axis X and rigid along axis Z between the membrane and the transmission arm.

In FIG. 19 another exemplary embodiment of a pressure sensor advantageously comprising a flexible hinge 115 between the membrane 4 and the arm 14 can be seen. This hinge is of the spring or flexure beam type. In FIG. 19, this is a flexure beam 116 which enables the strain along the Z axis induced by the membrane deformation to be entirely transmitted, while restricting the parasitic strain along X axis that is along the axis of the arm 14 due to this deformation. This link has some flexibility along the axis X so as not to impede the membrane deformation, and some rigidity to transmit the entire deformation from the membrane to the arm.

The alternative embodiments have been described regarding a pressure sensor with strain gauge detection, but the alternative of FIGS. 4, 5A, 5B, 6A, 6B, 7, 9, 10, 11, 12A, 12B, 13 to 19 are applicable to pressure sensors with capacitive detection or resonant pressure sensors represented in FIG. 2A, 2B, 3 and FIG. 8 respectively.

The implementation of several lever arms can be considered, each transmitting the deformation to distinct detection means provided about the membrane, the lever arms extending radially.

Further, different alternatives can be combined without departing from the scope of the present invention.

Thanks to the invention, the membrane and detection means are decoupled, which enables them to be separately optimized.

Furthermore, the amplification of the stress in the case of a resonant sensor or with strain gauge detection and the amplification of the movement in the case of a capacitive detection sensor provides a high sensitivity gain, the pressure sensor can be made more efficient or its size can be reduced.

Besides, thanks to the invention, the manufacture of differential measurement pressure sensors is technologically simplified, both in the case of the use of piezoresistive detection means as well as capacitive or resonant ones. This differential measurement enables the signal/noise ratio to be increased and the thermal sensitivity of the sensor to be restricted.

Furthermore, the technology for manufacturing pressure sensors according to the invention is very close to technologies for manufacturing MEMS and/or NEMS inertial sensors in surface technology, it is therefore possible to combine most of the existing methods. It is also then possible to co-integrate these different sensors as represented in FIGS. 13 and 14.

In the particular case of a strain gauge detection, the gauge can be of nanometric cross-section, which ensures a higher stress concentration and provides an increased sensitivity. Furthermore, the gauges are protected from the external medium by the cap.

In the case of a capacitive detection, the volume of the cavity 10 does not intervene in the electrostatic air gap between the membrane and the fixed electrode. A cavity 10 having a high volume under vacuum can then be made, which enables the obtaining of a reference vacuum likely to be more stable and higher than in conventional sensors.

Furthermore, the electrostatic air gap lying between the membrane and the fixed electrode is well controlled because it is defined by a sacrificial layer.

The vacuum closing of the cavity is made during sealing, for example through eutectic, anodic, SDB (Silicon Direct Bonding), or direct sealing. In this case, the sealing uses surface forces to ensure adhesion of both substrates . . . , this type of closing enables a good vacuum quality to be obtained, which is more reliable than that obtained by means of a deposition plugging.

Besides, the manufacturing method enables a getter material to be inserted in the vacuum cavity 10, which is particularly interesting in the case where a high and stable over time reference vacuum is desired, in particular to make a low pressure sensitive sensor.

Finally, the electrical reconnections of the membrane and the substrate can be simplified, using a TSV (Through Silicon Via) type technology which is integrated to the manufacturing method by surface technology of the sensitive part of the sensor, and allowing reconnections either by the front face, or the back face of the sensor.

An exemplary method for manufacturing the pressure sensor with strain gauge detections of FIGS. 1A and 1B will now be described using FIGS. 15A to 15H, each figure representing the element in top and cross-section view.

The locations of different parts of the pressure sensor, being made in the different steps represented, are designated by the references of these parts.

It relates to a manufacturing method in surface technology that is through successive deposition and machining of thin layers on a base substrate.

In the beginning, there is a SOI (Silicon on Insulator) substrate 100 which may be made of a BOX ("Buried Oxide") of 1 μm thickness and an active silicon layer of 0.2 μm thickness. The second layer can be obtained by epitaxy or silicon or SiGe deposition.

The silicon upper layer 102 has a thickness between a few tens nm and a few μm. The oxide layer of the SOI substrate is designated as 101.

Figure 15A:
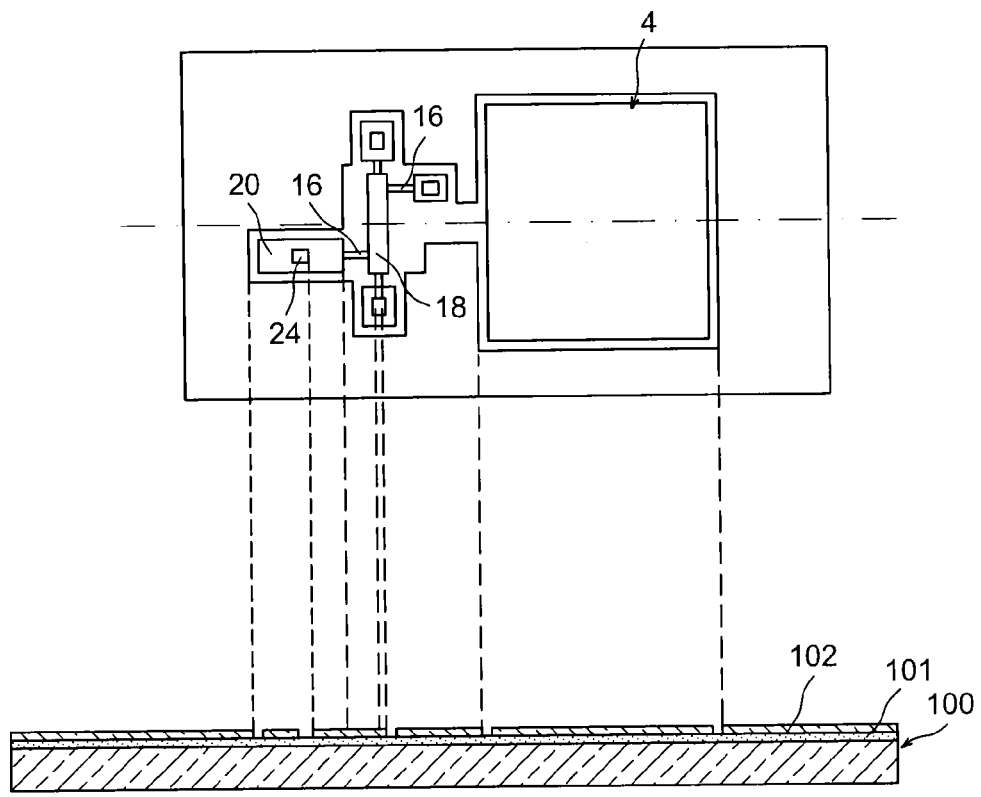
FIGS. 15A-15H are top views and longitudinal cross-section views of different steps for manufacturing a pressure measurement device according to the invention.
Figure 15B:
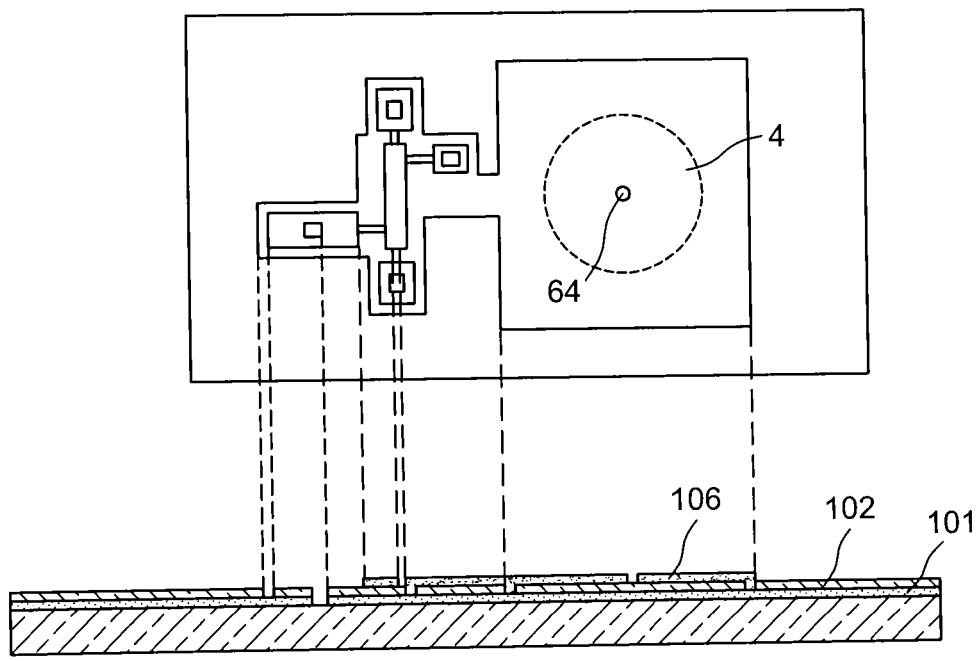
Figure 15C:
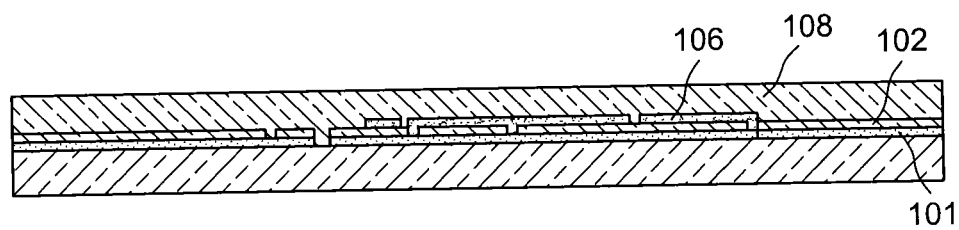
Figure 15D:
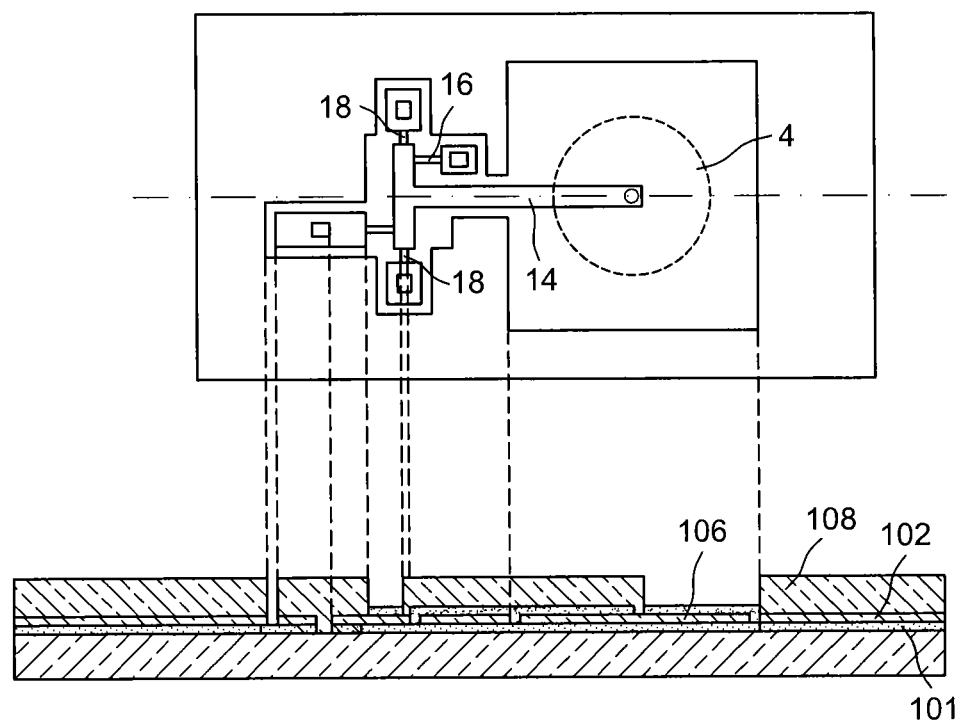
Figure 15E:
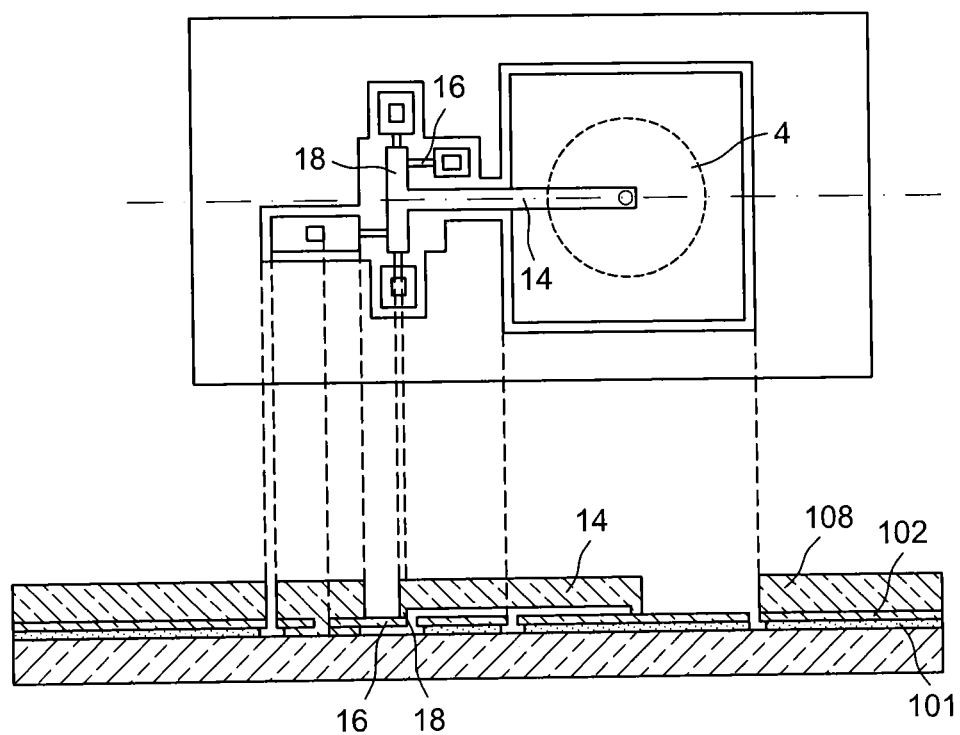
Figure 15F:
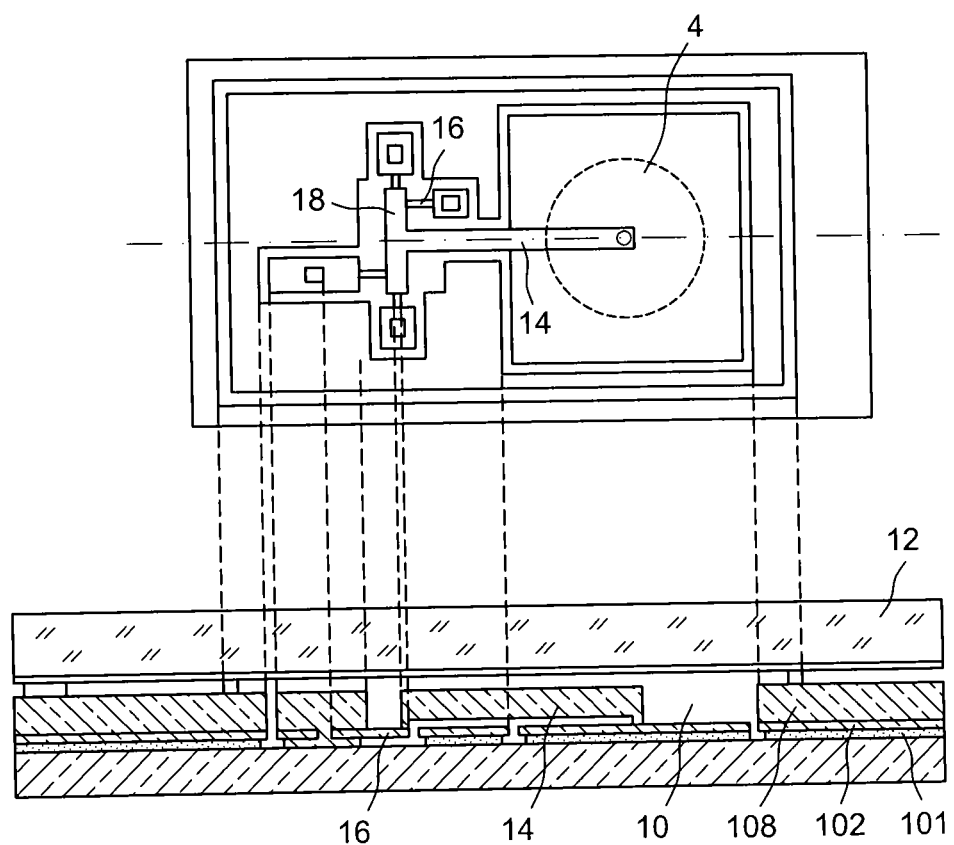

A lithography step is performed in order to define the strain gauges, the torsion axis, the edge of the membrane 4, the edge of the areas of contact and embedding of the gauges, and the torsion axis and the opening of the reconnection in the back face. In FIG. 15A, openings at the contacts of embedding pads are made, which enables electrical contacts to be retrieved between the substrate 100 and the active layer 102 during the epitaxy step, following the oxide etching in these openings.

Then, an etching of the silicon layer is performed ending on the oxide layer 101. The remaining resin is removed.

The element represented in FIG. 15A is obtained.

During a following step, a deposition of the SiO$_2$ layer 106 is performed.

Then, a lithography is performed to protect the strain gauges, the membrane 4 and to define the opening of contact areas and embedding pads of the gauges and the torsion axis, and the opening of the securing area 64 of the arm 14 to the membrane 4.

An oxide etching of the layers 101 and 106 then occurs ending on the silicon of the layer 102 and the silicon of the SOI substrate. The remaining resin is removed. The element thus obtained is visible in FIG. 15B.

During a following step, a single crystal silicon layer or a polycrystalline silicon layer 108 deposition occurs, for example through epitaxy having typically a thickness between 1 μm and a few tens μm. A mechanochemical polishing of the layer 108 can be performed. The element obtained is visible in FIG. 15C.

During a following step, a lithography is performed on the layer 108 in order to define the opening area of the membrane 4, and the opening area of the gauges 16, and define the arm 14 and the contact isolation areas. Then, an etching of the layer 108 is performed ending on a SiO$_2$ layer 106 and 101. The remaining resin is removed. The element obtained is visible in FIG. 15D.

During a following step, the arm 14, the torsion axis and the gauges are released through etching for example by means of vapour hydrofluoric acid. During this step, the layer 106 is entirely etched as well as part of the SiO$_2$ of the SOI substrate. During this step, the membrane 4 is not yet released. The element obtained is visible in FIG. 15E.

During a following step, a vacuum sealing of the cap is performed by means of a bead 13. Alternatively, the sealing can be for example of the eutectic, or anodic type in the case of a glass cap, that is beadless, the sealing being achieved through direct adhesion of both surfaces 12 and 108. A cavity is made beforehand in the cap before sealing, at least above the movable parts.

The cap can have been prepared beforehand. The preparation of the cap can comprise the steps of making a cavity, depositing getter, making electrical or even electronic (CMOS co-integration) routings in the case of a eutectic sealing . . . .

The tight cavity 10 around the membrane is thus formed.

Then, a thinning of the substrate is performed for example through abrasion in the back face or "back-grinding" and mechanochemical polishing. The element obtained is visible in FIG. 15F.

During a following step, a deposition of a metal layer is performed on the back face of the substrate in order to make the contact in the back face.

Then, a lithography is performed on this layer to bind the contact in the back face and finally an etching of the metal layer is performed. The resin on the remaining metal layer is removed.

A new lithography is performed in the back face to bound the contact isolation area and the opening of the membrane 4, as well as an etching of the substrate in the back face, for example through deep reactive-ion etching (DRIE) ending on the oxide layer 101 of the SOI substrate. The remaining resin is removed.

Figure 15G:
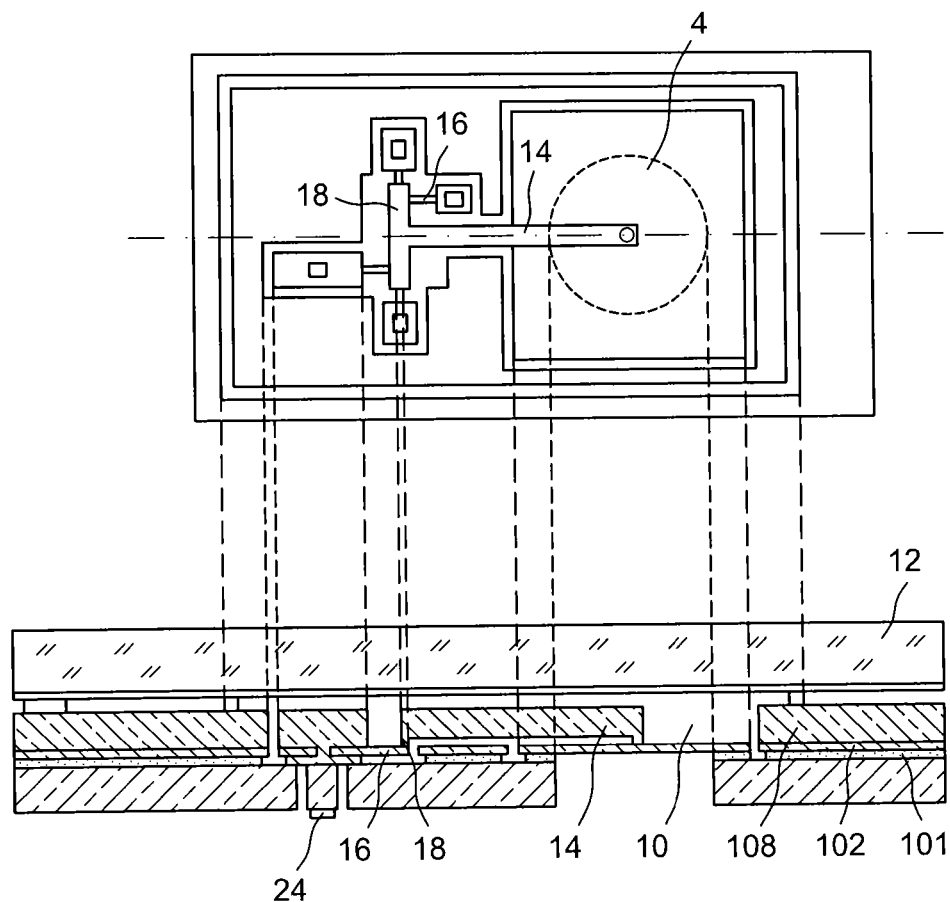

The element obtained is visible in FIG. 15G.

Finally, an etching in the back face of the oxide layer of the SOI substrate is performed. The membrane is released. Machining the inertial sensor is made simultaneously as etching the MEMS part (FIG. 15D) ending on the layer 101 and the release of the inertial sensor is made during step 15E.

Figure 15H:
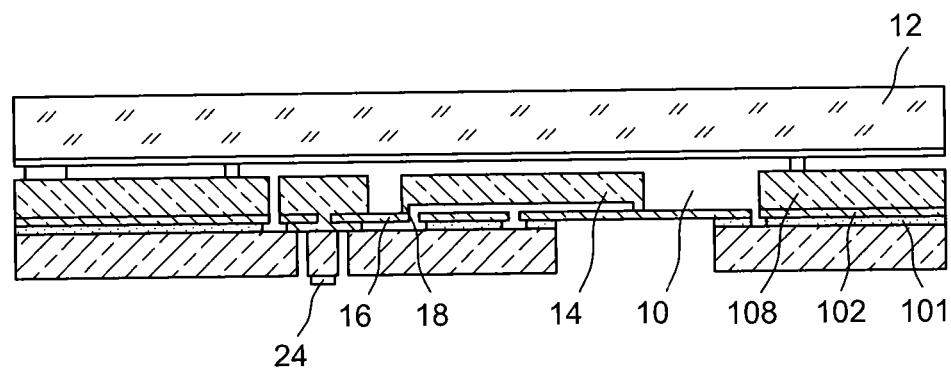

The element obtained is visible in FIG. 15H.

Alternatively, it is contemplatable to use a standard substrate in lieu of a 501 substrate, on which a deposition of a sacrificial layer, for example of oxide, has been performed, as well as a deposition of a first polysilicon or SiGe-Poly layer. The following steps are similar to those described starting from the SOI substrate.

Thickness values are only given by way of example. Generally, the (oxide) sacrificial layers are between a few tens nm and a few microns, and the active layers, such as Si, SiGe . . . are between a few tens nm and a few tens μm.

The pressure measurement device according to the invention can be used in any field where a pressure measurement is required, for example in the automotive, medical, avionic fields and also in consumer applications.

Furthermore, this sensor can be used to make a microphone for consumer applications, as for example in portable phones, or in the medical field to make hearing aids . . . .

The invention claimed is:

1. A MEMS and/or NEMS pressure measurement device, comprising:
    at least one deformable membrane suspended on a substrate, a face of the membrane being configured to be subjected to a pressure to be measured;
    a detector configured to detect deformation of the deformable membrane, said detector being provided at least partly on the substrate;
    a transmission device configured to transmit the deformation of the deformable membrane to the detector, said transmission device being non-deformable; and
    a hinging element, which rotatably hinges the transmission device to the substrate about an axis substantially parallel to the plane of the membrane and being provided facing another face of the membrane opposite to the face configured to be subjected to the pressure to be measured, such that at least beyond a given pressure said transmission device and the membrane are movably integral with each other, and such that the transmission device transmits to the detector, in an amplified manner, the deformation or the stress from the deformation of the membrane.

2. The pressure measurement device according to claim 1, wherein the transmission device and the membrane are movably integral with each other at least beyond the given pressure, in a maximum deformation area of the membrane.

3. The pressure measurement device according to claim 1, wherein the transmission device comprises at least one longitudinal arm comprising at least one first end at which the detector is located and a second end at which the arm is integral with the membrane at least beyond the given pressure.

4. The pressure measurement device according to claim 3, wherein the second end of the arm is mechanically integral with the membrane regardless of the pressure value.

5. The pressure measurement device according to claim 3, wherein a spacing is provided between the second end of the arm and the membrane for a pressure lower than the given pressure.

6. The pressure measurement device according to claim 5, wherein the arm is electrically connected to the membrane.

7. The pressure measurement device according to claim 5, wherein the given pressure is equal or less than the pressure to be measured.

8. The pressure measurement device according to claim 4, wherein the longitudinal arm is integral with the membrane through a connection being flexible along the longitudinal axis of the arm and rigid along an axis of deformation of the membrane.

9. The pressure measurement device according to claim 3, the hinging element including at least one torsion beam connecting the first end of the longitudinal arm to the detector, which is orthogonal to the longitudinal arm, the rotation axis being formed by said torsion beam which is secured on the one hand to the first end of the arm and on the other hand to the substrate and to the detector.

10. The pressure measurement device according claim 3, wherein the transmission device further comprises at least one flexure beam, substantially parallel to the longitudinal arm, the rotation axis being formed by said flexure beam which is secured on the one hand to the longitudinal arm and on the other hand to the substrate.

11. The pressure measurement device according to claim 10, wherein the longitudinal arm has a "U" pattern, this pattern comprising two ends corresponding to said first ends, the latter being respectively connected to the detector through side extension beams.

12. The pressure measurement device according to claim 1, comprising at least one element for rigidifying the membrane by forming at least one extra-thickness area on the membrane.

13. The pressure measurement device according to claim 1, wherein the transmission device comprises at least one longitudinal arm comprising at least one first end at which the detector is located and a second end at which the arm is integral with the membrane at least beyond the given pressure, a counterweight is attached to the arm at the first end of the arm.

14. The pressure measurement device according to claim 1, comprising several deformable membranes subjected to the same pressure, the transmission device and all the membranes being movably integral with each other at least beyond the given pressure.

15. The pressure measurement device according to claim 1, comprising a stop provided facing the membrane opposite the face of the membrane which is subjected to the pressure so as to restrict the deformation thereof.

16. The pressure measurement device according to claim 1, comprising a cap on the substrate and defining a cavity about the membrane opposite the face subjected to the pressure to be measured.

17. The pressure measurement device according to claim 16, wherein the face of the membrane which is subjected to the pressure to be measured and the environment the pressure of which is to be measured are communicated through the cap and/or between the cap and the substrate.

18. The pressure measurement device according to claim 1, wherein the detector comprises at least one suspended strain gauge connected by one end to the substrate through an anchor pad and by another end to a torsion beam or to the transmission arm.

19. The pressure measurement device according to claim 18, wherein the detector comprises at least one suspended strain gauge connected by one end to the substrate through an anchor pad and by another end to the torsion beam or to the transmission arm and wherein the detector comprises two strain gauges attached by one end to the torsion beam on either side thereof and by another end to the substrate through anchor pads.

20. The pressure measurement device according to claim 18, the hinging element including at least one torsion beam connecting the first end of the longitudinal arm to the detector, which is orthogonal to the longitudinal arm, the rotation axis being formed by the at least one torsion beam which is secured on the one hand to the first end of the arm and on the other hand to the substrate and to the detector, and wherein the detector comprises at least one resonator connected by one end to the at least one torsion beam and by another end to an anchor pad on the substrate, an excitation device of the resonator, and a device for detecting the resonant frequency of the resonator.

21. The pressure measurement device according to claim 1, wherein the detector is of the variable capacitance type.

22. The pressure measurement device according to claim 21, wherein the detector comprises at least one first fixed electrode on the substrate and at least one first movable electrode integral with the transmission device and facing the at least one first fixed electrode.

23. The pressure measurement device according to claim 22, comprising at least one second fixed electrode and at least one second movable electrode, said at least one second fixed electrode and said at least one second movable electrode being located opposite the at least one first fixed electrode and said at least one first movable electrode with respect to the rotation axis so as to form a differential measurement device.

24. The pressure measurement device according to claim 1, comprising an active device for compensating static pressure.

25. The pressure measurement device according to claim 24, wherein the active device for compensating static pressure comprises a pair of electrodes, one of the electrodes being integral with the transmission device and the pair of electrodes being located on the side of the membrane with respect to the axis of rotation of the transmission device on the substrate and the membrane.

26. The pressure measurement device according to claim 24, wherein the active device for compensating the static pressure comprises an electrode formed below the membrane on the substrate.

27. The pressure measurement device according to claim 1, comprising a device for performing self-tests and/or a self-calibration.

28. The pressure measurement device according to claim 27, wherein the device for performing self-tests and/or a self-calibration comprise a pair of electrodes, one of the electrodes being integral with the transmission device, the pair of electrodes being opposite the membrane with respect to the axis of rotation of the transmission device on the substrate.

29. The pressure measurement device according to claim 1, comprising a cap on the substrate and defining a cavity about the membrane opposite the face subjected to the pressure to be measured and wherein the cavity is tight and wherein a vacuum is made in said tight cavity to form an absolute pressure sensor.

30. The pressure measurement device according to claim 1, comprising a cap on the substrate and defining a cavity about the membrane opposite the face subjected to the pressure to be measured and wherein the cavity is connected to the external environment to form a relative pressure sensor or a microphone.

31. A MEMS and/or NEMS assembly comprising at least one pressure measurement device according to claim 1 and at least one inertial sensor made on and in the same substrate.

* * * * *